United States Patent [19]

Burch et al.

[11] Patent Number: 4,771,405

[45] Date of Patent: Sep. 13, 1988

[54] HIDDEN CONTROL BITS IN A CONTROL REGISTER

[75] Inventors: Kenneth R. Burch, Austin, Tex.; Gordon R. Burns, Lafayette, Ind.

[73] Assignee: Motorola, Inc., Schaumburg, Ill.

[21] Appl. No.: 851,993

[22] Filed: Apr. 14, 1986

[51] Int. Cl.[4] .............................................. G11C 7/00
[52] U.S. Cl. .................................. 365/189; 365/230; 307/291
[58] Field of Search ............... 365/189, 244, 154, 195, 365/230, 233; 307/291, 445, 471, 279; 364/200 MS File, 900 MS File

[56] References Cited

U.S. PATENT DOCUMENTS

| | | | |
|---|---|---|---|
| 4,110,842 | 8/1978 | Sarkissian et al. | 307/279 |
| 4,231,085 | 10/1980 | Bazlen et al. | 364/200 |
| 4,374,331 | 2/1983 | Yamamoto et al. | 307/291 |
| 4,585,997 | 4/1986 | Lin | 307/445 |

FOREIGN PATENT DOCUMENTS 1523883  9/1978  United Kingdom .

OTHER PUBLICATIONS

Len K, "Logic Designers Manual" Reston Publishing Co., Reston, Va., 1977, pp. 173-177.

Primary Examiner—Stuart N. Hecker
Assistant Examiner—Glenn A. Gossage
Attorney, Agent, or Firm—John A. Fisher; Vincent B. Ingrassia; Robert L. King

[57] ABSTRACT

First and second unused bits of a multi-bit mapped register are utilized to control a desired function. Each of the bits are capable of assuming first and second stable states. The control function is enabled when the first bit is in the first state and the second bit is in a second state. The function is disabled when the first bit is in the second state and the second bit is in the first state. The function remains unaltered when the first and second bits are each in the same state.

7 Claims, 1 Drawing Sheet

```
 7 6 5 4 3 2 1 0
┌─┬─┬─┬─┬─┬─┬─┬─┐
│D│C│B│A│X│X│X│X│
└─┴─┴─┴─┴─┴─┴─┴─┘
```
*FIG. 1*
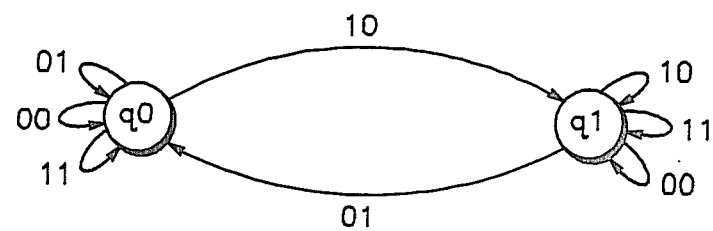
*FIG. 2*
*FIG. 3*
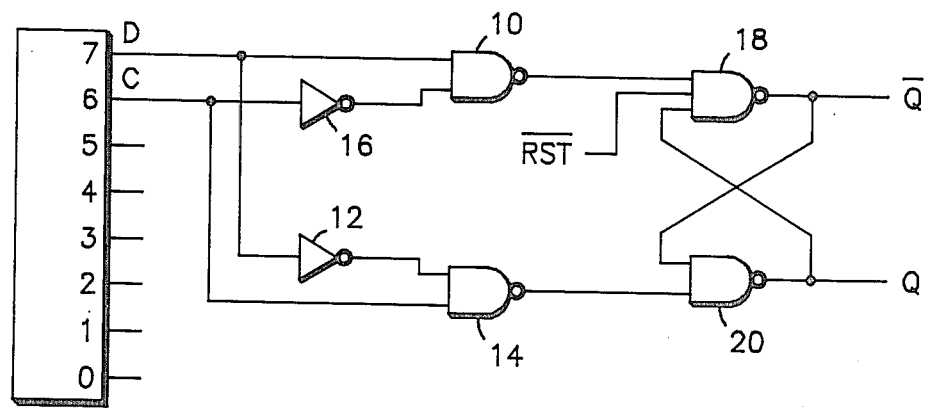

HIDDEN CONTROL BITS IN A CONTROL REGISTER

BACKGROUND OF THE INVENTION

This invention relates generally to control circuitry, and more particularly to a method and circuit for hiding a control function in a control register of a microprocessor or the like.

Often times, a memory mapped register is used to perform a control function. For example, an address register may be used to select one of several LCD display registers. It may also be true that only the least significant bits (e.g. the four LSBs of eight bits) are required to perform the desired function. If an on/off control for the entire LCD display function is required and there is no control register available, it would be awkward and inefficient to create an additional register to perform the simple on/off function.

One approach is to use one unused bit of the address register to perform the control function. For example, a "1" in the selected bit would enable the LCD function while a "0" in the selected bit would disable it. There are conditions, however, wherein it is desirable or necessary that the address register contain either all 1's or all 0's. This could, perhaps, cause the on/off bit to be forced into the wrong state resulting in the unwanted enabling or disabling of the LCD function.

SUMMARY OF THE INVENTION

It is an object of the present invention to provide an improved method and circuit for hiding a control function in a control register.

It is a further object of the invention to implement a control function with two unused bits of a control register.

According to a broad aspect of the invention there is provided a method for controlling a function by utilizing an unused portion of a multibit register. First and second unused bits in the register each capable of assuming first and second stable states are first located. The function is enabled by forcing the first bit into the first state and the second bit into the second state. The function is disabled by forcing the first bit into the second state and the second bit into the first state, the function remaining unaltered if the first and second bits are in the same state.

According to a further aspect of the invention there is provided a control circuit comprising a multi-bit register having at least first and second unused bits capable of assuming first and second states a flip-flop having set and reset inputs; first logic circuitry having inputs coupled to the first and second unused bits and having an output coupled to the reset input for resetting the flip-flop when the first bit is in the second state and the second bit is in the first state; and second logic circuitry having inputs coupled to the first and second bits and having an output coupled to said set input for setting the flip-flop when the first bit is in the first state and the second bit is in the second state.

The above and other objects of the present invention will be better understood from the following detailed description taken in conjunction with the accompanying drawings, in which:

BRIEF DESCRIPTION OF THE DRAWINGS

FIG. 1 illustrates an eight-bit register;

FIG. 2 is a state diagram illustrating how the hidden control function operates; and FIG. 3 is a logic diagram which implements the control function of FIG. 2.

DESCRIPTION OF THE PREFERRED EMBODIMENT

FIG. 1 illustrates eight bits (0-7) of a memory mapped register (for example, an address register) wherein only the four least significant bits (0-3) are required to generate the requisite number of unique addresses. Thus, bits A, B, C, and D (bits 4-7) may be considered unused. It is an object of this invention to utilize two of these unused bits (for example C and D) to perform a control function. The function to be controlled must not be inadvertently enabled or disabled should the entire contents of the register (bits 0-7) assume an all "0" or all "1" condition. With this in mind, the hidden control function should operate as indicated by the state diagram in FIG. 2.

As will be recalled, there are conditions under which the address register will be forced to an all "0" or all "1" condition and it is desired that such a condition have no effect on the controlled function. FIG. 2 is a state diagram illustrating states $q_0$ and $q_1$ which may correspond respectively to the enabled and disabled state of the controlled function. If bits six and seven of the register are used to control the function, the state will shift from $q_0$ to $q_1$ only when D=1 and C=0. Similarly, the state will shift from $q_1$ to $q_0$ when D=0 and C=1. If the current state is $q_0$, the conditions of D and C corresponding to 01, 00 and 11 will not result in a state change. Similarly, if the current state is $q_1$, D and C corresponding to 00, 10, and 11 will not result in a state change.

FIG. 3 is a logic diagram which implements the function illustrated in FIG. 2. As can be seen, D is applied to a first input of NAND gate 10 and, after inversion in inverter 12, to a first input of NAND gate 14. Signal C is applied to the second input of NAND gate 14 and, after inversion in inverter 16 to a second input of NAND gate 10. The outputs of NAND gates 10 and 14 are applied respectively to the first inputs of NAND gates 18 and 20. The output of NAND gate 18 ($\overline{Q}$) is coupled to the second input of NAND gate 20, and the output of NAND gate 20 (Q) is coupled to a second input of NAND gate 18. A reset signal ($\overline{RST}$) is coupled to a third input of NAND gate 18.

Assuming first that Q=0 and $\overline{Q}$=1 (corresponding to state $q_1$ in FIG. 2), a 00 input (i.e. C=0, D=0) will cause a high output at NAND gate 10 and a high output at NAND gate 14. Since both inputs to NAND gate 20 are high, the output of NAND gate 20 (Q) will remain a zero. Since the Q output is fed back to the input of NAND gate 18, $\overline{Q}$ will remain a one. If we next assume that C=1 and D=1, the situation remains the same since the output of NAND gate 14 remains high. Finally, if C=0 and D=1, the output of NAND gate 14 remains high thus precipitating no change in the outputs of NAND gates 18 and 20. Should, however, C=1 and D=0, the output of NAND gate 14 goes low causing the Q output of NAND gate 20 to go high. This high is applied to one input of NAND gate 18. Since D=0, the output of NAND gate 10 is likewise high and is applied to the second input of NAND gate 18. Assuming for the time being that the reset signal $\overline{RST}$ is also high, the output $\overline{Q}$ will go low. This low is applied to a second input of NAND gate 20 thus latching the states of Q and $\overline{Q}$ corresponding to the state $q_0$ in FIG. 2. It can be readily seen that if C and D should assume the states 00, 01 or 11, there will be no change in the outputs Q and $\overline{Q}$. If however, D=1 and C=0, the output of NAND gate 10 will be low and the output of NAND gate 14 high. The low at the output of NAND gate 10 will cause the output of NAND gate 18 ($\overline{Q}$) to go high. This high is applied to the second input of NAND gate 20 causing its output (Q) to go low thus switching back to state $q_1$. Reset signal $\overline{RST}$ is provided to force Q high when $\overline{RST}$ goes low.

Thus, there has been accomplished both a method and circuit whereby a function can be controlled using two unused bits of a memory mapped register. The state of the controlled function will not be altered if both of the bits are either 0 or 1. In this manner, the controlled function is not inadvertantly enabled or disabled if the register is forced to all zeros or all ones.

The above description is given by way of example only. Changes in form and details may be made by one skilled in the art without departing from the scope of the invention as defined by the appended claims.

We claim:

1. In a data processor having a multi-bit register with at least first and second unused bits each capable of assuming first and second logic states and said register capable of assuming first and second states for use to control a predetermined function, a control circuit comprising:
    first logic means having inputs coupled to said first and second unused bits of the multi-bit register and having an output for providing a first signal when said first unused bit is in said second logic state and said second unused bit is in said first logic state;
    second logic means having inputs coupled to said first and second unused bits and having an output for providing a second signal when said first unused bit is in said first logic state and said second unused bit is in said second logic state; and
    third logic means coupled to the first and second logic means for receiving the first and second signals and providing an output indicating the first and second states of the multi-bit register, wherein said output remains unaltered if said first and second unused bits are in the same logic state.

2. A control circuit according to claim 1 wherein said first logic means comprises:
    a first inverter having an input coupled to said first unused bit and having an output; and
    a first NAND gate having a first input coupled to the output of said first inverter, having a second input coupled to said second unused bit and having an output coupled to said reset input.

3. A control circuit according to claim 2 wherein said second logic means comprises:
    a second inverter having an input coupled to said second unused bit and having an output; and
    a second NAND gate having a first input coupled to the output of said second inverter and having a second input coupled to said first unused bit, the output of said NAND gate being coupled to said set input.

4. A control circuit according to claim 3 wherein said third logic means comprises a flip-flop having set and reset inputs and a Q and $\overline{Q}$ output and comprises:
    a third NAND gate having a first input coupled to the output of said first NAND gate and having a second input coupled to said Q output; and
    a fourth NAND gate having a first input coupled to the output of said second NAND gate and having a second input coupled to said $\overline{Q}$ output.

5. A control circuit according to claim 4 wherein said third NAND gate has a third input coupled to a reset signal.

6. A method for controlling a function in a data processor in response to first and second states of an unused portion of a multi-bit register, said register having first and second unused bits each capable of assuming first and second logic states, comprising the steps of:
    providing first logic means having inputs coupled to the first and second unused bits of the multi-bit register, said first logic means providing a first signal when said first unused bit is in said second logic state and said second unused bit is in said first logic state;
    providing second logic means having inputs coupled to said first and second unused bits of the multi-bit register, said second logic means providing a second signal when said first unused bit is in said first logic state and said second unused bit is in said second logic state; and
    coupling third logic means to the first and second logic means, said third logic means receiving the first and second signals and providing an output which indicates the first and second states of the multi-bit register and which remains unaltered if the first and second unused bits are in the same logic state.

7. In a data processor having a multi-bit register with first and second unused bits each capable of assuming first and second logic states, said register capable of assuming first and second states, a method for controlling a predetermined function in the data processor with the first and second unused bits, comprising the steps of:
    providing a first signal in response to the first unused bit assuming the second logic state and the second unused bit assuming the first logic state;
    providing a second signal in response to the first unused bit assuming the first logic state and the second unused bit assuming the second logic state; and
    providing a third signal in response to the first and second signals, said third signal indicating the first and second states of the multi-bit register and remaining unaltered if the first and second unused bits are in the same logic state.

* * * * *